US008592767B2

(12) United States Patent
Rappe et al.

(10) Patent No.: US 8,592,767 B2
(45) Date of Patent: Nov. 26, 2013

(54) TUNABLE FERROELECTRIC SUPPORTED CATALYSTS AND METHOD AND USES THEREOF (75) Inventors: Andrew M. Rappe, Penn Valley, PA (US); Alexie M. Kolpak, Philadelphia, PA (US); Ilya Grinberg, Fairlawn, NJ (US)

(73) Assignee: The Trustees of The University of Pennsylvania, Philadelphia, PA (US)

( * ) Notice: Subject to any disclaimer, the term of this patent is extended or adjusted under 35 U.S.C. 154(b) by 731 days.

(21) Appl. No.: 12/376,492

(22) PCT Filed: Aug. 7, 2007

(86) PCT No.: PCT/US2007/017616
§ 371 (c)(1),
(2), (4) Date: Jul. 28, 2010

(87) PCT Pub. No.: WO2008/094211
PCT Pub. Date: Aug. 7, 2008

(65) Prior Publication Data
US 2011/0009679 A1 Jan. 13, 2011

Related U.S. Application Data (60) Provisional application No. 60/835,947, filed on Aug. 7, 2006, provisional application No. 60/908,795, filed on Mar. 29, 2007.

(51) Int. Cl.
*C07C 1/04* (2006.01)
(52) U.S. Cl.
USPC ............ 250/338.2; 502/5; 502/340; 502/341; 502/349; 502/350; 502/351; 502/353; 502/354; 502/355

(58) Field of Classification Search
USPC ............ 250/338.2; 502/5, 340–341, 349–351, 502/353–355
See application file for complete search history.

(56) References Cited

U.S. PATENT DOCUMENTS

| 3,728,694 A | 4/1973 | Rohrer |
| 4,477,401 A | 10/1984 | Haemann et al. |
| 4,514,441 A | 4/1985 | Alexander |
| 4,792,463 A | 12/1988 | Okada et al. |
| 4,963,390 A | 10/1990 | Lipeles et al. |
| 4,997,725 A * | 3/1991 | Pujare et al. .................. 429/482 |
| 5,028,455 A | 7/1991 | Miller et al. |

(Continued)

OTHER PUBLICATIONS

Bao, et al., "Structural, Dielectric, and Ferroelectric Properties of PbTiO3 Thin Films by a Simple Sol-Gel Technique", Mater. Sci. and Eng. B94, Mar. 2002, 269-274.

(Continued)

*Primary Examiner* — Brian McCaig
(74) *Attorney, Agent, or Firm* — Woodcock Washburn, LLP (57) ABSTRACT

Disclosed are tunable catalysts and methods of controlling the activity of a catalyst. For example, disclosed are methods of controlling the activity of a catalyst, comprising providing a catalyst, comprising a ferroelectric substrate of finite thickness comprising two opposing surfaces, the ferroelectric substrate being characterized as having a polarization; an electrode surmounting one of the surfaces of the ferroelectric substrate; and a catalytically active material surmounting the surface of the ferroelectric substrate opposing the electrode; and subjecting the ferroelectric substrate to a controllable electric field to give rise to a modulation of the polarization of the ferroelectric substrate, whereby the modulation of the polarization controllably alters the activity of one or more chemical species on the catalytically active material.

7 Claims, 4 Drawing Sheets

(56) References Cited

U.S. PATENT DOCUMENTS

| | | | |
|---|---|---|---|
| 5,064,733 A * | 11/1991 | Krist et al. | 429/489 |
| 5,453,294 A | 9/1995 | Ogi et al. | |
| 5,555,486 A | 9/1996 | Kingon et al. | |
| 5,990,416 A | 11/1999 | Windisch, Jr. et al. | |
| 6,146,935 A | 11/2000 | Park et al. | |
| 6,342,177 B1 | 1/2002 | Kitaoka | |
| 6,376,090 B1 | 4/2002 | Kijima | |
| 6,491,985 B2 * | 12/2002 | He | 427/450 |
| 7,060,510 B2 | 6/2006 | Bonnell et al. | |

OTHER PUBLICATIONS

Bligaard, et al., "The Bronsted-Evans-Polanyi Relation and the Volcano Curve in Heterogeneous Catalysis", J. Catal., Feb. 2004, 225, 206-217.

Block, et al., "Electrostatic field effects in surface reactivity: Adsorption, dissociation and catalytic reaction of nitric oxide", Surf. Sci., Apr. 3, 1991, 246, 125-134.

Bouquet, "Ferroelectric Thin Films Prepared by a Polymeric Precursor Method", Innovative Processing and Synthesis of Ceramic, Glasses, and Composites, Ceramic Transactions, vol. 85, the Am. Ceram. Soc. Inc, Westerville, OH, (no month available) 1998, 333-334.

Brankovic, et al, "Metal Monolayer Deposition by Replacement of Metal Adlayers on Electrode Surfaces", Surface Science, Mar. 1, 2001, 474, L173-L179.

Cabrera, et al., "Catalysis of Reactions Involving Oxides of Carbon and Nitrogen by the Ferroelectric Compound Potassium Niobate", Mater. Res. Bull., Sep. 1979, 14, 1155-1166.

Cho, et al., "Solution Deposition and Heteroepitaxial Crystallization of LaNiO3 Electrodes for Integrated Ferroelectric Devices", Appl. Phys. Lett., Nov. 17, 1997, 71, 3013-3015.

Cooper, et al., "Supported metal Electronic Structure: Implications for Molecular Adsorption", Phys. Rev. B, Aug. 29, 2005, 72, 081409-1-081409-4.

Dahl, et al., "Electronic Factors in Catalysis: The Volcano Curve and the Effect of Promotion in Catalytic Ammonia Synthesis", Appl. Catal. A., Dec. 20, 2001, 222(1-2), 19-29.

Dong, et al., "Fatigue-Free La-Modififed PbTiO3 Thin Films Prepared by Pulsed-Laser Deposition on Pt/Ti/SiO2/Si Substrates", Appl. Phys. Lett., Mar. 3, 2003, 82, 1449-1451.

Doyle, et al., "Hydrogenation on Metal Surfaces: Why are Nanoparticles More Active Than Single Crystals?", Angew, Chem.-Int. Ed., Jun. 12, 2003, 42, 5240-5243.

Francis, et al., "Epitaxial Growth of Cu(100) and Pt(100) Thin Films on Perovskite Substrates", Thin Solid Films, Aug. 2006, 496, 317-325.

Futamura, et al., "Involvement of Catalyst Materials in Nonthermal Plasma Chemical Processing of Hazardous Air Pollutants", Catalysis Today, Mar. 15, 2002, 72(3-4), 259-265.

Gao, et al., "Microstructure of PbTiO3 Thin Films Deposited on (001)MgO by MOCVD", J. Mater. Res, Jan. 1993, 8(1), 145-153.

Ge, et al., "Adsorption and Activation of CO Over Flat and Stepped Co Surfaces: A First Principles Analysis", J. Phys. Chem. B., Apr. 18, 2006, 110, 15368-15380.

Gomes, et al., "Interaction of Pd With a-Al2O3(0001): A Case Study of Modeling the Metal-Oxide Interface on Complex Substrates", Phys. Rev. B., Mar. 13, 2002, 65, 125414-1-125414-9.

Hammer, et al., "Improved Adsorption Energetics Within Density-Functional Theory Using Revised Perdew-Burke-Ernzerhof Functionals", Phys. Rev. B., Mar. 15, 1999, 59, 11, 7413-7421.

Harjuoja, et al., "Atomic layer deposition of PbZrO3 thin films", Applied Surface Science, Apr. 15, 2007, 253(12), 5228-5232.

Haruta, "Size and Support Dependency in the Catalysis of Gold", Catal. Today, Apr. 25, 1997, 36(1), 153-166.

Heiz, et al., "Fundamental Aspects of Catalysis on Supported Metal Clusters", J. Mater. Chem., Jan. 26, 2004, 14, 564-577.

Hohenberg, et al., "Inhomogeneous Electron Gas", Phys. Rev., Nov. 9, 1964, 136, B864-B871.

Holzer, et al., "Influence of ferroelectric materials and catalysts on the performance of non-thermal plasma (NTP) for the removal of air pollutants", Plasma Chem. and Plasma Processing, Dec. 2005, 25(6), 595-611.

Huang, et al., "Combined Effect of Thickness and Stress on Ferroelectric Behavior of Thin BaTiO3 Films", J. Appl. Phys., Mar. 1, 2003, 93, 2855-2860.

Hwang, et al., "Atomic layer deposition and electrical properties of PbTiO3 thin films using metallorganic precursors and H2O", Journal of the Electrochemical Society, Jan. 19, 2007, 154(3), G69-G76.

Hyman, et al., "Theoretical study of the adsorption and dissociation of Oxygen on Pt(111) in the presence of homogeneous electric fields", J. Phys. Chem. B., Mar. 15, 2005, 109, 6304-6310.

Ichikawa, et al., "Electron Holographic 3-D Nano-Analysis of Au/TiO2 Catalyst at Interface", Journal of Electron Microscopy, Jan. 10, 2003, 52, 21-26.

Iijima, et al., "Ferroelectric Properties of Sol-Gel-Derived PbTiO3 Type Thin Films", Jpn. J. Appl. Phys., Sep. 1996, 35, 4930-4932.

Inoue et al., "Effect of Surface Acoustic Wave Propagated on Ferroelectric LiNbO3 on Catalytic Activity of a Deposited Pd Thin Film", J. Phys. Chem., Mar. 1992, 96(5), 2222-2225.

Inoue, et al., "Use of LiNbO3 for Design of Device-Type Catalysts with Activity Controllable Functions", Catalysis Today, May 3, 1993, 16(3-4), 487-494.

Inoue, et al., "Different catalytic activity of a Cu thin-film deposited on a positive and negative polar ferroelectric surface", Chem. Phys. Lett., Aug. 4, 1989, 160, 118-120.

Jung et al., "Switchable Single c-Domain formation in a Heteroepitaxial PbTiO3 Thin Film on a (001) Nb-SrTi03 Substrate Fabricated by Means of Hydrothermal Epitaxy", Appl. Phys. Lett., Apr. 15, 2005, 86, 252901-1-252901-3.

Kabashima, et al., "Hydrogen generation from water, methane, and methanol with nonthermal plasma", IEEE Transactions on Industry Applications, Mar./Apr. 2003, 39(2), 340-345.

Kanno, et al., "Preparation of Pb-Based Ferroelectric Thin Films at Room Temperature Using Excimer-Laser-Assisted Multi-Ion-Beam Sputtering", Jpn. J. Appl. Phys., Sep. 1995, 34, 5211-5215.

Kawai, et al., "Ferroelectric effect in catalytic reactions over a BaTiO3 surface at its Curie-point (120 oC)", Zeitschrift fur Physikalische. Chemie., Feb. 1973, 86, 268-273.

Kim, et al., "Electric field-induced adsorption/desorption of Oxygen on a Pd-SnOx-Si3N4-SiO2-Si-Al capacitor", Jpn. J. Appl. Phys., Feb. 15, 1998, 37, L255-L257.

Kim, "Atomic layer deposition of metal and nitride thin films: Current research efforts and applications for semiconductor device processing", J. Vac. Sci. and Tech. B., Nov./Dec. 2003, 21, 2231-2261.

Kim, et al., "Effects of Surface Structures of MgO(100) Single Crystal Substrates on Ferroelectric PbTiO3 Thin Films Grown by Radio Frequency Sputtering", J. Vac. Sci. Technol. A., Jan./Feb. 1995, 13, 95-100.

Kohn, et al., "Self-Consistent Equations Including Exchange and Correlation Effects", Phys. Rev., Nov. 1965, 140, A1133-A1138.

Li, et al., "Atomic Layer Deposition of Ultrathin Copper Metal Films From a Liquid Copper(l) Amidinate Precursor", J. of the Electrochemical Society, Sep. 13, 2006, 153, C787-C794.

Lim, et al., "Atomic layer deposition of transition metals", Nature Materials, Oct. 26, 2003, 2, 749-754.

Ma, et al., Well-ordered arrays of pyramid-shaped ferroelectric BaTiO3 nanostructures, Applied Physics Letters, Nov. 3, 2003, 83(18), 3770-3772.

Mason, et al., "First-Principles Extrapolation Method for Accurate CO Adsorption Energies on Metal Surfaces", Phys. Rev. B., Apr. 5, 2004, 69, 161401-1-161401-4.

Molina, et al., "Active Role of Oxide Support During OC Oxidation at Au/MgO", Phys. Rev. Lett., May 23, 2003, 90, 206102-1-206102-4.

Neophytides, et al., "TPD and Cyclic Voltammetric Investigation of the Origin of Electrochemical Promotion in Catalysis", J. Phys. Chem., Aug. 22, 1995, 99, 17063-17067.

Norskov, et al., "Universality in Heterogenous Catalysis", Journal of Catalysis, Mar. 25, 2002, 209, 275-278.

(56) References Cited

OTHER PUBLICATIONS

Okumura, et al., "Durable and selective activity of Pd Loaded on WO3/ZrO2 for NO-CH4-O-2 in the presence of water vapor", Applied Catalysis B-Environmental, Mar. 10, 2003, 41(1-2), 137-142.

Okumura, et al., "Toluene Combustion Over Palladium Supported on Various Metal Oxide Supports", Appl. Catal. B., Feb. 19, 2003, 44, 325-331.

Pacchioni, et al., "Electric Field Effects in Heterogeneous Catalysis", J. Molec. Catal. A., May 23, 1997, 119(1-3), 263-273.

Park, et al., "Induction of an electronic perturbation in supported metal catalysts", J. Phys. Chem. B., Feb. 6, 2000, 104, 4418-4424.

Park, et al., "Modifications in the Catalytic Properties of Nickel Supported on Different Dielectric Oxides", Chem. Mater., Jan. 2002, 14(1), 273-280.

Parravano, "Ferroelectric Transitions and Heterogenous Catalsys", J. Chem. Phys., Feb. 1952, 20(2), 342-343.

Perdew, et al., "Accurate and simple analytic representation of the electron-gas correlation energy", Physical Review B., Jun. 15, 1992, 45, 13244-13249.

Perdew, et al., "Generalized Gradient Approximation Made Simple", Phys. Rev. Lett., Oct. 28, 1996, 77, 3865-3868.

Ramesh, "Structure and Properties of Ferroelectric PbZr0.2Ti0.8O3/YBa2Cu3O7 Heterostructures", J. Electron. Mater., Feb. 24, 1992, 21, 513-518.

Ramos, et al., "Desorption of carbon dioxide from small potassium niobate particles induced by the particles' ferroelectric transition", Surf. Sci., Jul. 2006, 17, 3472-3476.

Roland, et al., "Improved oxidation of air pollutants in a non-thermal plasma", Catalysis Today, Apr. 15, 2002, 73(3-4), 315-323.

Rousseau, et al., "Combination of a pulsed microwave plasma with a catalyst for acetylene oxidation", Appl. Phys. Lett., Sep. 20, 2004, 85, 2199-2201.

Sai, et al., "Ferroelectricity in Ultrathin Perovskite Films", Physical Review B., Jul. 7, 2005, 72, 020101-1-020101-4.

Saito, et al., "Effects of acoustic waves generated on a positively polarized lead strontium zirconium tianate substrate upn catalytic activity of a deposited Ag", Solid State Ionics, Nov. 2, 2000, 136, 819-823.

Saito, et al., "Effects of Thickness Extension Mode Resonance Oscillation of Acoustic Waves on Catalytic and Surface Properties. III. Ethanol Decomposition on a Thin Ag Film Catalyst Deposited on Negatively Polarized z-cut LiNbO3", J. Phys. Chem. B., Sep. 5, 2002, 106, 10179-10184.

Saito, et al., "Acoustic wave effects on catalysis, design of surfaces with artificially controllable functions for chemical reactions", Applied Surface Science, Jan. 15, 2001, 169-170, 259-263.

Shin, et al., "Fabrication of 3-dimensional PbZr1-xTixO3 nanoscale thin film capacitors for high density ferroelectric radom access memory devices", Journal of Nanoscience and Nanotechnology, Feb. 2006, 6(11), 3333-3337.

Sidorkin, et al., "Dielectric Properties of Thin PbTiO3 Films", Phys. of the Solid State, Oct. 2004, 46(10), 1906-1909.

Stadler, "Changing Properties of Metals by Ferroelectric Polarization Charging", Phys. Rev. Lett., Jun. 14, 1965, 14, 979-981.

Tzuzuki, et al., "Preparation and Ferroelectric Properties of Sol-Gel-Derived (Pb,Ca)TiO3 Thin Films", J. Mater. Sci. Lett., Feb. 1995, 10(3), 125-128.

Valden, et al., "Onset of Catalytic Activity of Gold Clusters on Titania with the Appearance of Nonmentallic Properties", Science, Sep. 11, 1998, 281, 1647-1650.

Vayenas, et al., "Non-Faradaic Electrochemical Modification of Catalytic Activity: A Status Report", Catal. Today, Jan. 6, 1992, 11, 303-442.

Vayenas, et al., "Dependence of Catalytic Rates on Catalyst Work Function", Nature, Feb. 15, 1990, 343, 625-627.

Vehkamaki, et al., "Atomic layer deposition of ferroelectric bismuth titanate BiTi3O12 thin films", Chemistry of Materials, Jul. 4, 2006, 18(16), 3883-3888.

Wasa, et al., "Basic Sputtering Process and Ferroelectric Properties of Single-Domain, Single-Crystal Thin Films of PbTiO3", Integrated Ferroelectrics, May 1998, 21, 451-461.

Wasileski, et al., "Potential-dependent chemisorption of carbon monoxide on platinum electrodes: new insight from quantum-chemical calculations combined with vibrational spectroscopy", J. Electroanalytical Chem., Mar. 16, 2001, 500(1-2), 344-355.

Yamamoto, et al., "Towards ideal NOx control technology using a plasma-chemical hybrid process", IEEE Transactions on Industry Applications, Sep./Oct. 2001, 37(5), 1492-1498.

Zanetti, et al., "Preparation and Characterization of SrBi2Nb2O9 Thin Films Made by Polymeric Precursors", J. Mater. Res., Oct. 1998, 13, 2932-2935.

Zanetti, et al., "Microstructure and Phase Evolution of SrTiO3 Thin Films on Si Prepared by the Use of Polymeric Precursors", Meter. Lett., Jun. 1997, 31, 173-178.

\* cited by examiner

TUNABLE FERROELECTRIC SUPPORTED CATALYSTS AND METHOD AND USES THEREOF

CROSS-REFERENCE TO RELATED APPLICATIONS

This application is the National Stage of International Application No. PCT/US2007/017616, filed Aug. 7, 2007, which claims the benefit of U.S. Provisional Application No. 60/835,947, filed Aug. 7, 2006 and U.S. Provisional Application No. 60/908,795, filed Mar. 29, 2007, the disclosures of which are incorporated herein by reference in their entirety.

STATEMENT OF GOVERNMENT INTEREST

The invention was made with U.S. Government support. The Government may have certain rights in the invention under Office of Naval Research Grant No. N00014-00-1-0372, Air Force Office of Scientific Research Grant No. FA9550-04-1-0077, and National Science Foundation Grant No. LRSM DMR05-20020.

FIELD OF THE INVENTION

The field relates to ferroelectric nanostructures, methods of making such structures, and devices containing the same. The field also pertains to catalysis and catalytic materials.

BACKGROUND OF THE INVENTION

Various scientific and patent publications are referred to herein. Each is incorporated by reference in its entirety.

Catalysts are important materials for the use in the synthesis of chemical compounds, such as petrochemicals, pharmaceuticals, polymers, and the like. One class of catalysts that has received a great deal of attention in this respect is that of oxide-supported metal catalysts, which are used in numerous industrial applications. Much progress has been made in determining the relationship between catalytic activity and the size, shape, and distribution of metal particles or films on a wide range of oxide supports. Studies have also begun to elucidate the effect of the support material on the properties of the catalytic metal surface, showing that the surface polarization, acidity, and geometry, as well as the concentration of surface defects, all play a significant role in determining the behavior of the catalyst. However, the ability to vary and control the properties of catalytic materials in real time during a chemical synthesis is still lacking. Accordingly, there remains the need to be able to actively control the polarization of catalytic materials which would have great utility in providing "tunable catalysis".

SUMMARY OF THE INVENTION

In one aspect of the present invention there are provided methods of controlling the activity of a catalyst, comprising: providing a catalyst, comprising: a ferroelectric substrate of finite thickness comprising two opposing surfaces, the ferroelectric substrate being characterized as having a polarization; an electrode surmounting one of the surfaces of the ferroelectric substrate; and a catalytically active material surmounting the surface of the ferroelectric substrate opposing the electrode; and subjecting the ferroelectric substrate to a controllable electric field to give rise to a modulation of the polarization of the ferroelectric substrate, whereby the modulation of the polarization controllably alters the activity of one or more chemical species on the catalytically active material.

In other aspects of the present invention, there are provided methods of controlling the activity of a catalyst, comprising: providing a catalyst, comprising: a ferroelectric substrate of finite thickness, the ferroelectric substrate being characterized as having a polarization; and a catalytically active material surmounting the surface of the ferroelectric substrate; and subjecting the ferroelectric substrate to a controllable electric field to give rise to a modulation of the polarization of the ferroelectric substrate, whereby the modulation of the polarization controllably alters the activity of one or more chemical species on the catalytically active material. Other aspects of the present invention provide products made by these methods.

The present invention also provides tunable catalysts, comprising: a ferroelectric substrate of finite thickness comprising two opposing surfaces, the ferroelectric substrate being characterized as having a polarization; an electrode surmounting one of the surfaces of the ferroelectric substrate; and a catalytically active material surmounting the surface of the ferroelectric substrate opposing the electrode, wherein the electrode and the catalytically active thin film are capable of subjecting the ferroelectric substrate to a controllable electric field to modulate the polarization of the ferroelectric substrate, whereby the modulation of the polarization is capable of controllably altering the activity of one or more chemical species on the catalytically active material.

Additional aspects of the invention provide tunable catalysts, comprising: a ferroelectric substrate of finite thickness, the ferroelectric substrate being characterized as having a polarization; and a catalytically active material surmounting the surface of the ferroelectric substrate, wherein the ferroelectric substrate is capable of being subjected to a controllable electric field to modulate the polarization of the ferroelectric substrate, whereby the modulation of the polarization is capable of controllably altering the activity of one or more chemical species on the catalytically active material. Products made using the tunable catalysts are further aspects of the present invention.

In one non-limiting embodiment as described further herein, a new paradigm of dynamical control of surface structure and reactivity is illustrated using density functional theory calculations of the adsorption of molecules and atoms to the surface of ultrathin Pt(100) films supported on ferroelectric perovskite substrates such as $PbTiO_3$. Reorienting the polarization direction of the substrate dramatically changes the chemisorption energies of CO, O, C, and N and alters the reaction pathways for dissociation of CO, $O_2$, $N_2$, and NO. Controlling the structural and electronic effects of a polarized substrate on the metal surface gives rise to tunable catalysis.

The general description and the following detailed description are exemplary and explanatory only and are not restrictive of the invention, as defined in the appended claims. Other aspects of the present invention will be apparent to those skilled in the art in view of the detailed description of the invention as provided herein.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIG. 1: Atomic structure and induced charge density for the PbO/Pt interfaces. Pb, Ti, O, and Pt atoms are shown as cyan, blue, red, and grey spheres. The P⁻ and P⁺ interfaces are on the left and right, respectively. The contour plot axes are chosen to show the surface cations and anions, and their bonds to the Pt atoms. The general trends of interfacial charge rearrangement are similar for the analogous TiO2/Pt interfaces; for illustration, see Ref. 21.

FIG. 3 (a-d): Chemisorption energies[24] for CO, O, C, and N as a function of polarization direction and Pt thickness for the PbO/Pt interfaces. Red plus signs indicate the P+ interface and blue minus signs represent the P− interface. The zero of energy corresponds to $E_{chem}$ on unsupported Pt(100). e-h) Site preference energies for CO, O, C, and N. The solid black lines give $E_{site}$ for the adsorbates on unsupported Pt(100). Points above the dotted lines represent a change in the preferred bonding site relative to Pt(100).

DETAILED DESCRIPTION OF ILLUSTRATIVE EMBODIMENTS

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

As used herein, spatial or directional terms, such as "inner", "outer", "left", "right", "up", "down", "horizontal", "vertical", and the like, relate to the invention as it is shown in the drawing figures. However, it is to be understood, that the invention can assume various alternative orientations and, accordingly, such terms are not to be considered as limiting. Further, all numbers expressing dimensions, physical characteristics, and so forth, used in the specification and claims are to be understood as being modified in all instances by the term "about". Accordingly, unless indicated to the contrary, the numerical values set forth in the following specification and claims can vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 7.1, or 2.9 to 8.2, or 7.8 to 10.

Terms:

As used herein, the term "perovskite" means a structure with an empirical formula given by $ABO_3$, where A is a cation, a combination of cations, or a combination of cations and vacancies, B is a cation, a combination of cations, or a combination of cations and vacancies, and O is Oxygen.

As used herein, the term "epitaxial" means the growth on a crystalline substrate of a crystalline substance that copies the crystalline orientation of the crystalline substrate. The terms "lattice-matching," "registration," and "epitaxy," may be used herein unless otherwise indicated.

In one aspect of the present invention there are provided methods of controlling the activity of a catalyst. These methods include providing a catalyst, comprising: a ferroelectric substrate of finite thickness comprising two opposing surfaces, the ferroelectric substrate being characterized as having a polarization; an electrode surmounting one of the surfaces of the ferroelectric substrate; and a catalytically active material surmounting the surface of the ferroelectric substrate opposing the electrode; and subjecting the ferroelectric substrate to a controllable electric field to give rise to a modulation of the polarization of the ferroelectric substrate, whereby the modulation of the polarization controllably alters the activity of one or more chemical species on the catalytically active material.

The controllable electric field can modulate the magnitude of the bulk polarization, the direction of the bulk polarization, or both, of the ferroelectric substrate. The polarization can be controllably switched from positive to negative, from negative to positive, or any combination thereof. The polarization can also be controllably switched in real time. The controllable electric field can be transient, time-varying, or constant. The activity of the catalytically active material suitably includes chemisorption, desorption, dissociation, reaction, or any combination thereof, of one or more chemical species on the catalytically active material.

The catalytically active material can be in the form of one or more thin films, one or more islands, one or more lines, one or more nanoparticles, or any combination thereof.

Suitable ferroelectric substrates comprise a perovskite, a variant of a perovskite structure, a tungsten-bronze structure, a bismuth oxide layered structure, a water-soluble ferroelectric, a ferroelectric organic polymer, a ferroelectric ceramic-polymer, or any combination thereof. Species of suitable ferroelectric substrate materials are provided in the list below:

| Formula | name |
|---|---|
| perovskites, corner-sharing O octahedra | |
| $BaTiO_3$ | barium titanate (BT) |
| $PbTiO_3$ | lead titanate (PT) |
| $PbZr_xTi_{1-x}O_3$ | lead zirconate titanate (PZT) |
| $(Pb_{1-y}La_y)(Zr_xTi_{1-x})O_3$ | lead lanthanum zirconate titanate (PLZT) |
| $Pb(Mg_{1/3}Nb_{2/3})O_3$ | lead magnesium niobate (PMN) |
| $Pb(Zn_{1/3}Nb_{2/3})O_3$ | lead zinc niobate (PZN) |
| $Pb(Mg_{1/3}Nb_{2/3})O_3$—$PbTiO_3$ | PMN-PT |
| $Pb(Zn_{1/3}Nb_{2/3})O_3$—$PbTiO_3$ | PZN-PT |
| $KNbO_3$ | potassium niobate |
| $(K_xNa_{1-x})NbO_3$ | potassium sodium niobate |
| $K(Ta_xNb_{1-x})O_3$ | potassium tantalate niobate |
| tungston-bronze structures | |
| $PbNb_2O_6$ | lead niobate |
| $(Pb_{1-x}Ba_x)Nb_2O_6$ | lead barium niobate (PBN) |
| $K_3Li_2Nb_5O_{15}$ | potassium lithium niobate (KLN) |
| $(Sr_xBa_{1-x})Nb_5O_{15}$ | strontium barium niobate (SBN) |
| $(Sr_xBa_{1-x})NaNb_5O_{15}$ | (SBNN) |
| Bismuth oxide layered structures | |
| $Bi_4Ti_3O_{12}$ | |
| $Bi_7Ti_{4+x/2}Nb_{1-x}W_{x/2}O_{21}$ | |
| $PbBi_2Nb_2O_9$ | |
| $SrBi_2Ta_2O_9$ | strontium bismuth tantalate |
| variants of perovskite structure | |
| $LiNbO_3$ | lithium niobate |
| $LiTaO_3$ | lithium tantalate |
| water soluble ferroelectrics | |
| $KH_2PO_4$ | potassium dihydrogen phosphate (KDP) |
| $(NH_2CH_2COOH)_3H_2SO_4$ | triglycine sulfate (TGS) |
| $NaKC_4H_4O_6 \cdot 4H_2O$ | sodium potassium tantalate tetrahydrate |
| organic polymers | |
| $(CH2—CF2)n$ | polyvinylidene fluoride (PVDF) |
| | PVDF-trifluoroethylene |
| | ceramic-polymer combinations |

Suitable ferroelectric substrates can have a lattice constant substantially the same as the lattice constant of the catalytically active material. Particularly preferred ferroelectric substrates comprises $PbTiO_3$. Other preferred embodiments include the catalytically active metal comprising Pt. Preferably when $PbTiO_3$ is used, it is terminated with $TiO_2$. Such tunable and catalysts methods are especially useful when subjecting the ferroelectric substrate to a controllable electric field to improve the dissociation of CO from the Pt surface.

It is envisioned that in many other embodiments, suitable ferroelectric substrates do not necessarily have a lattice constant substantially the same as the lattice constant of the catalytically active material.

A variety of ferroelectric materials that can be suitably used are described in the following references, which are organized by type of material: G. Parravano, J. Chem. Phys. 20, 342 (1952). T. Kawai, K. Kunimoki, T. Kondow, T. Onishi, and K. Tamaru, "Ferroelectric effect in catalytic reactions over a BaTiO3 surface at its Curie-point (120° C.)", Zeitschrift fur Physikalische Chemie 86, 268 (1973). A. L. Cabrera, B. C. Sales, M. B. Maple, H. Suhl, G. W. Stupian, and A. B. Chase, "Catalysis of reactions involving oxides of carbon and nitrogen by the ferroelectric compound potassium niobate," Mater. Res. Bull. 14, 1155 (1979). C. Park and R. T. K. Baker, Chem. Mater. 14, 273 (2002). C. Park and R. T. K. Baker, "Induction of an electronic perturbation in supported metal catalysts," J. Phys. Chem. B 104, 4418 (2000). E. Ramos-Moore, J. A. Baier-Saip, and A. L. Cabrera, "Desorption of carbon dioxide from small potassium niobate particles induced by the particles' ferroelectric transition," Surf. Sci. 17, 3472 (2006). Y. Inoue, T. Imai, K. Sato, "Different catalytic activity of a Cu thin-film deposited on a positive and negative polar ferroelectric surface," Chem. Phys. Lett. 160, 118 (1989). Y. Inoue and Y. Watanabe, Catalysis Today 16, 487 (1993). N. Saito, Y. Yukawa, and Y. Inoue, J. Phys. Chem. B 106, 10179 (2002). T. Yamamoto, M. Okubo, K. Hayakawa, and K. Kitaura, "Towards ideal NOx control technology using a plasma-chemical hybrid process," IEEE Transactions on Industry Applications 337,1492 (2001). S. Futamura, A. H. Zhang, H. Einaga, and H. Kabashima, "Involvement of catalyst materials in nonthermal plasma chemical processing of hazardous air pollutants," Catalysis Today 72, 259 (2002). U. Roland, F. Holzer, and F. D. Kopinke, "Improved oxidation of air pollutants in a non-thermal plasma," Catalysis Today 73, 315 (2002). H. Kabashima, H. Einaga, and S. Futamura, "Hydrogen generation from water, methane, and methanol with nonthermal plasma," IEEE Transactions on Industry Applications 39, 340 (2003). A. Rousseau, O. Guaitella, J. Ropcke, L. V. Gatilova, and Y. A. Tolmachev, "Combination of a pulsed microwave plasma with a catalyst for acetylene oxidation," Appl. Phys. Lett. 85, 2199 (2004). F. Holzer, F. D. Kopinke, and U. Roland, "Influence of ferroelectric materials and catalysts on the performance of non-thermal plasma (NTP) for the removal of air pollutants," Plasma Chem. and Plasma Processing 25, 595 (2005).

A number of suitable tunable catalysts can be fabricated using any of a variety of processes. For example, many methods used for making epitaxial materials can be used. Suitable methods can be adapted from the techniques described in the following references: *Hydrothermal epitaxy*: Jung et al., Appl. Phys. Lett. 86, 252901 (2005). *Sputtering*: S. Kim, et al., J. Vac. Sci. Technol. A 13, 95 (1995). A. S. Sidorkin et al., Phys. of the Solid State 46, 1906 (2004). G.-F. Huang and S. Berger, J. Appl. Phys. 93, 2855 (2003). *Spin coating*: Bao, et al., Mater. Sci. and Eng. B 94, 269 (2002). Wasa, et al., Integrated Ferroelectrics 21, 451 (1998). *Molecular beam epitaxy. Pulsed laser ablation*: R. Ramesh J. Electron. Mater. 21, 513 (1992). Z. Dong, M. Shen, and W. Cao, Appl. Phys. Lett. 82, 1449 (2003). *Metal organic chemical vapor deposition*: Y. Gao, et al., J. Mater. Res 8, 145 (1993). *Multi ion beam*: I. Kanno, Jpn. J. Appl. Phys. 34, 5211 (1995). *Sol-get processing*: A. Tzuzuki et al. J. Mater. Sci. Lett. 10, 125 (1995). Y. Iijima et al, Jpn. J. Appl. Phys. 35, 4930 (1996). C. R. Cho, et al., "Solution deposition and heteroepitaxial crystallization of $LaNiO_3$ electrodes for integrated ferroelectric devices," Appl. Phys. Lett. 71, 3013 (1997). *Polymeric precursor method*: S. M. Zanetti et al., J. Mater. Res. 13, 2932 (1998). S. M. Zanetti et al., Meter. Lett. 31, 173 (1997). V. Bouquet, Innovative processing and synthesis of ceramic, glasses, and composites, ceramic transactions, Vol. 85, the Am. Ceram. Soc. Inc, Westerville, Ohio, p. 333 (1998). *Atomic layer deposition*: Harjuoja, J. et al., Atomic layer deposition of PbZrO3 thin films. APPLIED SURFACE SCIENCE, 253 (12): 5228-5232 (2007); Hwang, G W et al., Atomic layer deposition and electrical properties of PbTiO3 thin films using metallorganic precursors and H2O, JOURNAL OF THE ELECTROCHEMICAL SOCIETY 154 (3): G69-G76 (2007); Shin, S, et al., Fabrication of 3-dimensional PbZr1-xTixO3 nanoscale thin film capacitors for high density ferroelectric random access memory devices, JOURNAL OF NANOSCIENCE AND NANOTECHNOLOGY 6 (11): 3333-3337 (2006). Vehkamaki, M, et al., Atomic layer deposition of ferroelectric bismuth titanate Bi4Ti3O12 thin films, CHEMISTRY OF MATERIALS 18 (16): 3883-3888 (2006).

A number of suitable methods for monolayer deposition of metals and atomic layer deposition, for example for use in depositing catalytically active materials on the ferroelectric substrates, can be suitably adapted from the following references: S. R. Brankovic et al, Surface science 474, L173 (2001). B. S. Lim, A. Rahtu, & R. G. Gordon, "Atomic layer deposition of transition metals," Nature Materials 2, 749 (2003). Z. Li, A. Rahtu, R. G. Gorden, J. of the Electrochemical Society 153, C787 (2006). H. Kim, "Atomic layer deposition of metal and nitride thin films: Current research efforts and applications for semiconductor device processing" J. Vac. Sci. and Tech. B 21, 2231 (2003).

A number of methods for fabricating ferroelectrics are also provided in the following: U.S. Pat. No. 5,028,455, Miller, et al. Jul. 2, 1991, Method for preparing plzt, pzt and plt sol-gels and fabricating ferroelectric thin films. U.S. Pat. No. 4,792,463, Okada, et al. Dec. 20, 1988, Method of producing ferroelectric thin film. U.S. Pat. No. 4,514,441, Alexander, Apr. 30, 1985, Dielectric materials. U.S. Pat. No. 3,728,694, Rohrer, Apr. 17, 1973, Thin film ferroelectric device. U.S. Pat. No. 4,477,401, Hagemann, et al. Oct. 16, 1984, Method of manufacturing a dielectric. U.S. Pat. No. 4,963,390, Lipeles, et al., Oct. 16, 1990, Metallo-organic solution deposition (MOSD) of transparent, crystalline ferroelectric films. U.S. Pat. No. 5,453,294, Ogi, et al., Sep. 26, 1995, Method of controlling crystal orientation of PZT and PLZT thin films on platinum substrates. U.S. Pat. No. 6,146,935, Park, et al., Nov. 14, 2000, Method for forming capacitor of semiconductor device using pre-bake. U.S. Pat. No. 6,342,177, Kitaoka, Jan. 29, 2002; Method for production of metal oxide thin film. U.S. Pat. No. 6,376,090, Kijima, Apr. 23, 2002, Method for manufacturing a substrate with an oxide ferroelectric thin film formed thereon and a substrate with an oxide ferroelectric thin film formed thereon.

Suitable ferroelectric substrates have a thickness of at least one unit cell of a ferroelectric single crystal or ceramic. Suitable ferroelectric substrates can have a thickness of at least two unit cells of a ferroelectric single crystal or ceramic. Ferroelectric substrates can have a thickness of at least about 0.1 nanometer, at least or up to about 1 nm, at least or up to about 2 nm, at least or up to about 5 nm, at least or up to about 10 nm, at least or up to about 20 nm, at least or up to about 50 nm, at least or up to about 100 nm, at least or up to about 200 nm, at least or up to about 500 nm, at least or up to about 1 micron, at least or up to about 2 micron, at least or up to about 5 micron, at least or up to about 10 micron, or even at least or up to about 100 micron.

Suitable electrodes comprise a metal, a metallic oxide, or any combination thereof. Suitable electrode metals comprise Al, Cu, Au, Ag, Pt, Ti, In, Sn, Sr, La or any combination thereof. In some embodiments, the lattice constant of the electrode suitably matches the lattice constant of the ferroelectric. In other embodiments, the lattice constant of the electrode does not need to match the lattice constant of the ferroelectric. Suitable metallic oxides comprise indium-tin-oxide, $SrTiO_3$, $SrRuO_3$, or any combination thereof. Suitable conductive electrodes can be a doped semiconductor. Additional conductive metallic oxides materials suitable for use in the electrodes are provided in "Conductive Metal Oxide Films for Photovoltaic Cells or Flat Panel Displays", U.S. Pat. No. 5,990,416 to Windisch, Jr., et al. Nov. 23, 1999, the entirety of which is incorporated by reference herein. Suitable electrodes can have a thickness of at least about 0.1 nanometer, at least or up to about 1 nm, at least or up to about 2 nm, at least or up to about 5 nm, at least or up to about 10 nm, at least or up to about 20 nm, at least or up to about 50 nm, at least or up to about 100 nm, at least or up to about 200 nm, at least or up to about 500 nm, at least or up to about 1 micron, at least or up to about 2 micron, at least or up to about 5 micron, at least or up to about 10 micron, at least or up to about 100 micron, or even at least or up to about 100 microns.

Suitable catalytically active materials comprise one monolayer of the metal or one unit cell of the metallic oxide. Catalytically active materials can consist essentially of one monolayer of the metal or one unit cell of the metallic oxide. Alternatively, suitable catalytically active materials can comprise two monolayers of the metal or two unit cells of the metallic oxide. The catalytically active material may also consist essentially of two monolayers of the metal or two unit cells of the metallic oxide. Suitable catalytically active materials comprise a transition metal or any other elemental metal, alloy, or both, that can be deposited, grown, or both, as a film, a nanoparticle, or both, on the ferroelectric substrate. The catalytically active materials may comprise one or more of chemical elements 21 to 30, 39 to 48, 71 to 80, or any combination thereof. Particularly preferred catalytically active materials include Pt, Pd, Rh, Ru, Fe, Ni, V, Ti, Al, or any combination thereof.

Other suitable oxide-supported catalytically active materials that can be used in the methods and tunable catalysts of the present invention are described further in the following references: M. Valden, X. Lai, and D. W. Goodman, Science 281, 1657 (1998). M. Haruta, Catal. Today 36, 153 (1997). U. Heiz and E. L. Bullock, J. Mater. Chem. 14, 564 (2004). K. Okumura, T. Kobayashi, H. Tanaka, and M. Niwa, Appl. Catal. B 44, 325 (2003), S. Ichikawa, T. Akita, M. Okumura, M. Haruta, K. Tanaka, and M. Kohyama, Journal of Electron Microscopy 52, 21 (2003). A. M. Doyle, S. K. Shaikutdinov, S. D. Jackson, and H. J. Freund, Angew, Chem.-Int. Ed. 42, 5240 03). J. R. B. Gomes, F. Illas, N. C. Hernández, A. Márquez, and J. F. Sanz, Phys. Rev. B 65, 125414 (2002). L. M. Molina and B. Hammer, Phys. Rev. Lett 90, 206102 (2003). V. R. Cooper, A. M. Kolpak, Y. Yourdshahyan, and A. M. Rappe, Phys. Rev. B 72, 081409 (2005).

Suitable controllable electric fields can be provided by applying an electrical potential between the electrode and the catalytically active material, by applying a varying or transient magnetic field between the electrode and the catalytically active material, by applying electro-magnetic radiation to the ferroelectric substrate, by applying ionizing radiation to the ferroelectric substrate, by AFM switching, by a scanning probe technique, or any combination thereof. More suitably, the controllable electric fields can be provided by sandwiching the ferroelectric between two electrodes, and applying a voltage between the two electrodes. Additionally, electric fields can be applied in the methods and tunable catalysts of the present invention by suitably adapting the techniques described in any of the following references: J. H. Block, H. J. Kreuzer and L. C. Wang, "Electrostatic field effects in surface reactivity: Adsorption, dissociation and catalytic reaction of nitric oxide," Surf. Sci. 246, 125 (1991). S. A. Wasileski, M. J. Weaver, M. T. M. Koper, "Potential-dependent chemisorption of carbon monoxide on platinum electrodes: new insight from quantum-chemical calculations combined with vibrational spectroscopy" J. Electroanalytical Chem. 500, 344 (2001). M. P. Hyman and J. W. Medlin, "Theoretical study of the adsorption and dissociation of Oxygen on Pt(111) in the presence of homogeneous electric fields", J. Phys. Chem. B 109, 6304 (2005). C. K. Kim, W. P. Kang, Y. H. Kim, N. I. Cho, "Electric field-induced adsorption/desorption of Oxygen on a Pd—SnOx—Si3N4-SiO2-Si—Al capacitor", Jpn. J. Appl. Phys. 37, L255 (1998). G. Pacchioni, J. R. Lomas, F. Illas, "Electric field effects in heterogeneous catalysis", J. Molec. Catal. A 119, 263 (1997). C. G. Vayenas, S. Bebelis, S. Ladas, Nature 343, 625 (1990). C. G. Vayenas, S. Bebelis, I. V. Yentekakis, H. G. Lintz, Ctal.

Today 11, 303 (1992). S. Neophytides and C. G. Vayenas, J. Phys. Chem. 99, 17063 (1995).

Tunable catalysts as provided herein can be used in catalytic converters, fuel cells, Fischer-Tropsch synthesis, hydrogenation, oxidation/combustion, synthesis of methanol, nitric acid, sulfuric acid, ammonia, or hydrogen, petroleum refining/processing, alkylation, catalytic cracking, naphtha reforming, steam reforming for synthesis gas production, transesterification, olefin polymerization, non-olefin polymerization, electrolysis of water, dissociation of ammonia, reduction of nitrogen oxides to elemental nitrogen, epoxidation, or any combination thereof. Accordingly, the one or more chemical species may comprise a proton, a deuteron, an atom, an atomic ion other than a proton, a molecule, a molecular ion, or any isotope or combination thereof. Any of number of products can be made according to the catalytic processes described herein. Suitable atoms or atomic ions can be characterized as having an atomic number in the range of from 2 to 92. In certain embodiments, it is desired that the chemical species include hydrogen, carbon, oxygen, nitrogen, sulfur, or any isotope or combination thereof. Suitable molecules or molecular ions can comprise at least one atom characterized as having an atomic number in the range of from 2 to 92.

It should also be noted that certain embodiments of the methods of controlling catalyst activity do not necessarily require an electrode. Accordingly, methods of controlling the activity of a catalyst, can include providing a catalyst, comprising: a ferroelectric substrate of finite thickness, the ferroelectric substrate being characterized as having a polarization; and a catalytically active material surmounting the surface of the ferroelectric substrate; and subjecting the ferroelectric substrate to a controllable electric field to give rise to a modulation of the polarization of the ferroelectric substrate, whereby the modulation of the polarization controllably alters the activity of one or more chemical species on the catalytically active material. Other aspects of the present invention provide products made by these methods.

A variety of tunable catalysts have been described herein above. Suitable catalysts include: a ferroelectric substrate of finite thickness comprising two opposing surfaces, the ferroelectric substrate being characterized as having a polarization; an electrode surmounting one of the surfaces of the ferroelectric substrate; and a catalytically active material surmounting the surface of the ferroelectric substrate opposing the electrode, wherein the electrode and the catalytically active thin film are capable of subjecting the ferroelectric substrate to a controllable electric field to modulate the polarization of the ferroelectric substrate, whereby the modulation of the polarization is capable of controllably altering the activity of one or more chemical species on the catalytically active material. Additional suitable features and aspects of the tunable catalysts are further described above.

The present invention also provides for variations in the tunable catalyst as described herein. Any one or more of the materials described herein, such as the electrode, the ferroelectric substrate, or the catalytically active material, may be morphologically characterized as taking the shape of a slab, a perforated slab, a fiber, a particle, a shell, a cylinder, a rod, a prism, a sphere, a hemisphere, or any combination thereof, e.g., a hemispherical shell. For example, tunable catalysts may comprise a ferroelectric particle made with an electrode and a catalytically active material opposing each other on opposing sides (e.g., opposing hemispheres) of the ferroelectric particle, such as a sphere of $PbTiO_3$ with the one hemisphere coated with Pt, and the other hemisphere coated with Al, with the "equator" uncovered by either Pt or Al. In a further modification of this embodiment, all the Pt parts of many such particles are fused and in electrical contact, as are the Al parts. Accordingly, the use of the phrase, "two opposing surfaces" is intended to be expanded beyond slabs to cover the variety of shapes, for example, the Al side and Pt side of each particle.

Other aspects of the invention provide tunable catalysts that do not necessarily require an electrode. These tunable catalysts include a ferroelectric substrate of finite thickness, the ferroelectric substrate being characterized as having a polarization; and a catalytically active material surmounting the surface of the ferroelectric substrate, wherein the ferroelectric substrate is capable of being subjected to a controllable electric field to modulate the polarization of the ferroelectric substrate, whereby the modulation of the polarization is capable of controllably altering the activity of one or more chemical species on the catalytically active material. Products made using the tunable catalysts are further aspects of the present invention.

Ferroelectric oxides are excellent support materials, offering dynamical control of surface structure and reactivity, with a wide range of available behavior in a single system. Ferroelectric materials have a spontaneous bulk polarization in the absence of an external field, and both the magnitude and the direction of the polarization can be changed by the application of an electric field. In addition, changes in polarization are accompanied by structural and chemical changes at the oxide/metal interface, resulting in a rich dependence of interfacial interactions on the oxide polarization. Ferroelectric oxide-supports greatly enhance the range of tunable parameters and enable external control of catalytic activity in real time.

EXAMPLES AND OTHER ILLUSTRATIVE EMBODIMENTS

The following are non-limiting examples that are representative only and that do not necessarily restrict the scope of the present invention.

A new paradigm of dynamical control of surface structure and reactivity can be illustrated using density functional theory calculations of the adsorption of molecules and atoms to the surface of ultrathin Pt(100) films supported on ferroelectric perovskite substrates such as $PbTiO_3$. Reorienting the polarization direction of the substrate dramatically changes the chemisorption energies of CO, O, C, and N and alters the reaction pathways for dissociation of CO, $O_2$, $N_2$, and NO. Controlling the structural and electronic effects of a polarized substrate on the metal surface gives rise to tunable catalysis.

Density functional theory[16,17] (DFT) was used to systematically investigate the effects of catalytic systems including a ferroelectric substrate on the electronic properties of a metal surface. One example of a suitable catalytic system includes studying ultrathin Pt films supported on a $PbTiO_3$(100) substrate. The chemisorption behavior of CO, C, O, and N to the Pt surface as a function of Pt film thickness on two different $PbTiO_3$(100) surfaces were examined to show that switching from positive to negative polarization results in dramatic changes in chemisorption strength and site-preference, particularly on monolayer-thick Pt films. In addition, trends in the dissociative chemisorption of CO, $O_2$, NO, and $N_2$ were estimated as a function of polarization direction and Pt thickness. The electronic structure responsible for these effects can also be changed, which demonstrates that similar effects are also expected in other metals.

Figure 1:
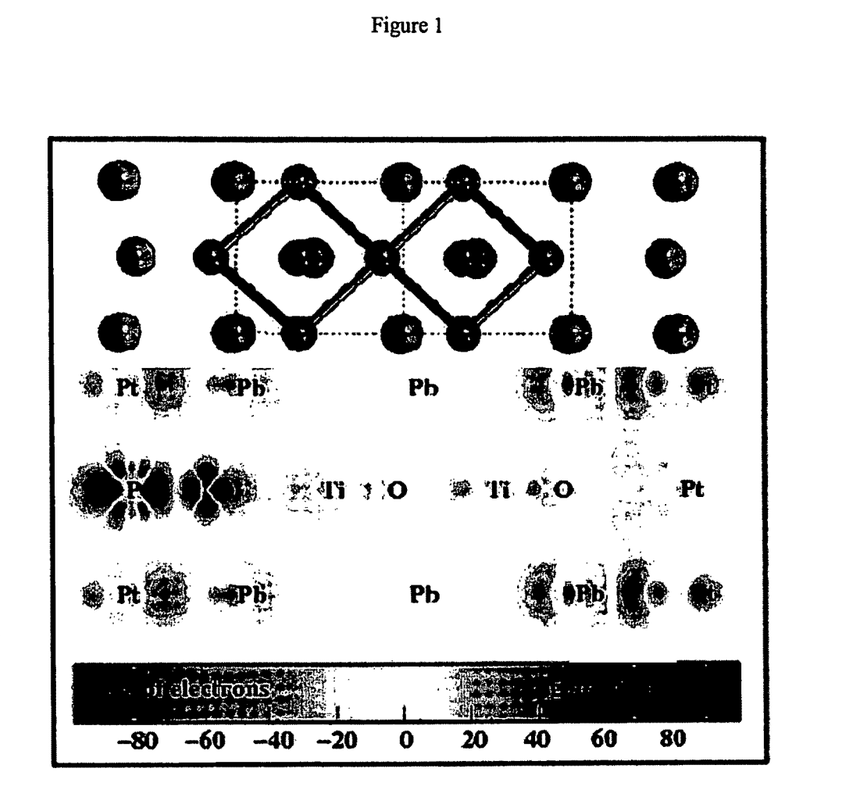
Figure 2:
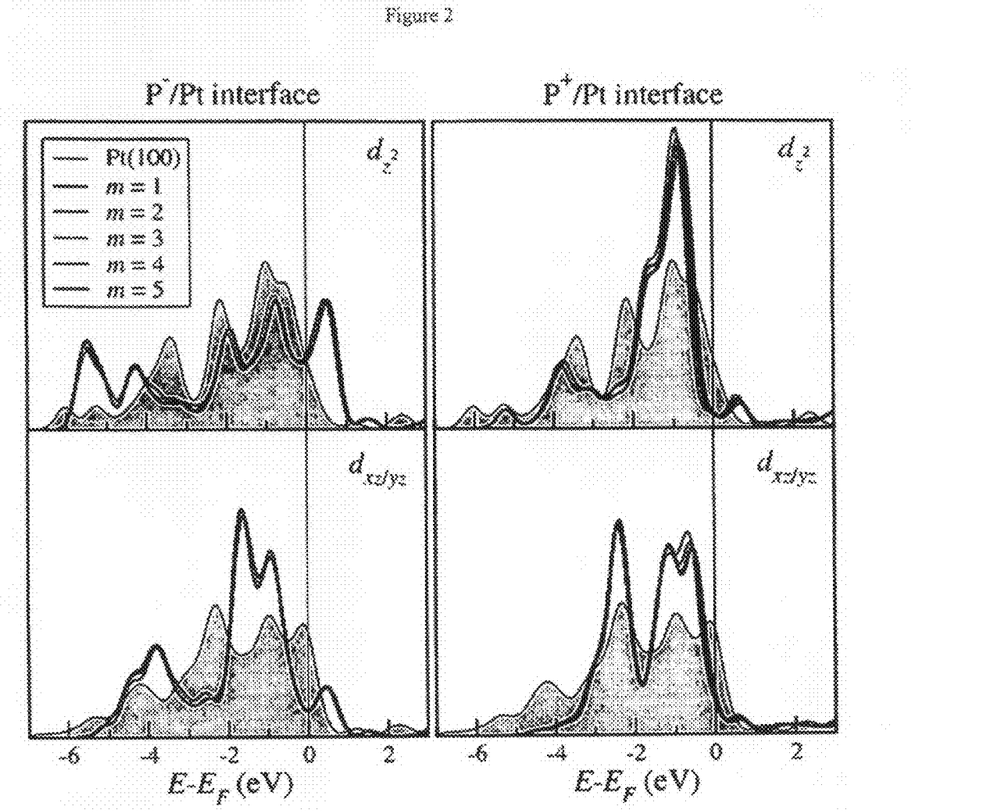
FIG. 2: Platinum $d_z^2$ and $d_{xz/yz}$ density of states (DOS) as a function of $PbTiO_3$ film thickness for one monolayer of Pt above the P_(left) and P+(right) PbO-terminated $PbTiO_3$, with m=1-5 oxide unit cells. The shaded grey curve shows the corresponding DOS for Pt(100). Regardless of the $PbTiO_3$ film thickness, the electronic structure of the interfacial Pt layer remains almost constant, suggesting that the Pt surface reactivity is also independent of the substrate thickness.

All DFT calculations were performed with the generalized gradient approximation[18,19] as implemented in the ab initio code DACAPO (http://dcwww.camp.dtu.dk/campos/Dacapo/). The structures were composed of two-unit-cell thick $PbTiO_3(100)$ films sandwiched between Pt(100) electrodes to form two PbO/Pt or $TiO_2$/Pt interfaces, as illustrated for PbO/Pt in FIG. 1. The interfacial Pt atoms were bound in the energetically-favored registry, above the surface Pb and O ions in the former, and above the surface oxygens in the latter. The structural and electronic properties of the interfaces were determined to be independent of the $PbTiO_3$ film thickness, as shown in FIG. 2; consequently, the system models the behavior of Pt films supported on substrates ranging from ultrathin to thick $PbTiO_3$ films. A slab geometry with periodic boundary conditions was used, with the in-plane lattice constant fixed to the theoretical $PbTiO_3$ value of 3.86 Å to model epitaxial growth on a $SrTiO_3$ substrate, upon which Pt(100) films have been successfully grown[20] ($SrTiO_3$ is a common experimental substrate which is lattice matched to ferroelectric $PbTiO_3$). Slabs were separated by more than 20 Å in the direction perpendicular to the surface, and a dipole correction was applied in the center of the vacuum to remove artificial fields. All structures with and without adsorbates were relaxed completely until the force on each atom was less than 0.01 eV/Å. The films remained ferroelectric,[21] with polarization perpendicular to the ferroelectric/metal interface and cation-anion displacements of 80-90% of the computed bulk values.

Figure 3:
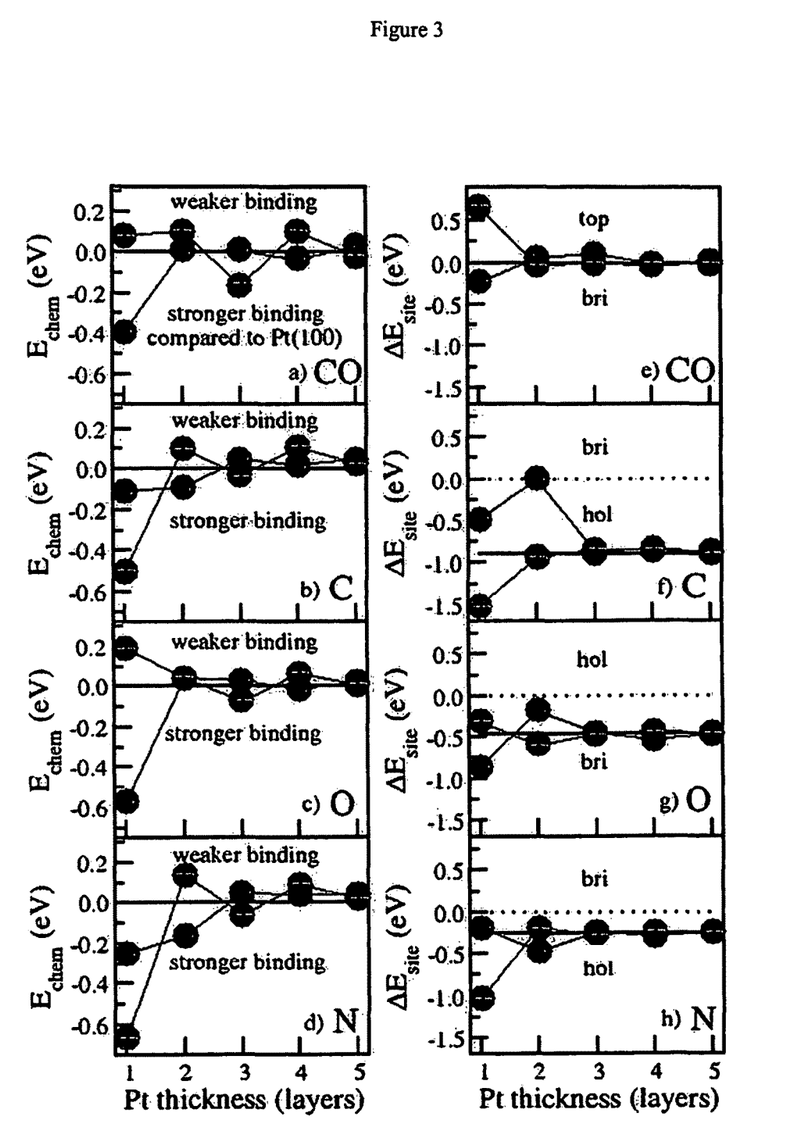
Figure 4:
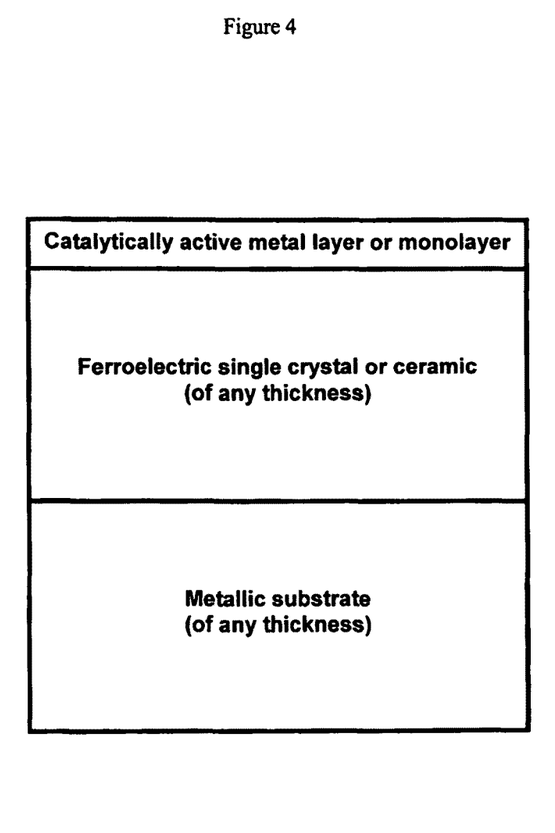
FIG. 4. Schematic of an embodiment of a ferroelectric oxide-supported tunable metal catalyst.

The effects of the polarization on molecular and atomic chemisorption energies on the Pt surface were dramatic, as shown in FIG. 3 *a-d*. Similar results were observed for both PbO- and $TiO_2$-terminated supports, but are focused here on PbO/Pt for brevity. For CO, C, O, and N, switching the $PbTiO_3$ polarization from $P^+$ to $P-$ induces changes of about 0.4 to about 0.6 eV in the chemisorption energy on a monolayer-thick Pt film. As the Pt film thickness is increased, the changes in chemisorption energy with respect to Pt(100) become less dramatic, but remain significantly greater than the error bar of 0.01 eV in the DFT calculations. As FIG. 3 demonstrates, the effects of the substrate polarization extend over a length scale greater than the screening length of Pt (~0.5 Å), indicating the importance of polarization-induced changes in atomic structure and chemical bonding in addition to the polarization charge. Surprisingly, the adsorption behavior does not vary monotonically with respect to film thickness, but oscillates relative to Pt(100) values, with opposite phases for the $P^+$ and $P^-$ interfaces, suggesting Friedel oscillations in the metal screening.

The oxide substrate polarization also has a significant effect on adsorption site preference energies. While the site preference energies converge to the unsupported Pt(100) values more quickly than the chemisorption energies, the changes were quite dramatic on a single-layer Pt film (FIG. 3 *e-h*). For instance, CO chemisorption is equally strong on the top and bridge sites on unsupported Pt(100), but an underlying $P^+$ interface induces a 0.55 eV bridge site preference. Flipping the polarization direction destabilizes adsorption at the bridge site, resulting in a top-site preference of 0.23 eV above the $P^-$ interface.

Such changes in molecular potential energy surfaces on the Pt film can have a large effect on reaction kinetics. Catalytic reactions with diatomic reactants can be modeled as two successive processes: dissociative chemisorption followed by associative desorption. If chemisorption is too favorable, then all the sites become covered with one reactant, blocking out the other. If it is not favorable enough, then the paucity of reactant slows the reaction. This makes the overall rate of a surface catalytic process sensitive to the dissociative chemisorption energy. Therefore, the plot of reaction rate versus dissociative chemisorption energy is sharply peaked, and is known as a "volcano curve."[22,33] When dissociative chemisorption of the diatomic molecule is the rate-determining step, it can be shown that the peak of the volcano occurs when the free energy $A_{diss} \approx 0$ or $E_{dis} \approx T\Delta S$, where T is the temperature and S is the entropy lost during the dissociative chemisorption. This provides a simple criterion for optimizing the reaction rate over a given catalyst, such as by selecting the optimal T for a particular reaction. Accordingly, tuning $E_{diss}$ by controlling the ferroelectric substrate polarization enables the optimization of reaction rates for a wide range of desired temperature and pressure conditions.

Controlling the dissociative chemisorption energies for CO, NO, $O_2$, and $N_2$ on $PbTiO_3$/Pt was investigated by tuning the polarization and Pt film thickness. As the data in Table I show, the magnitude of $E_{diss}$ depends strongly on the direction of the $PbTiO_3$ polarization, changing significantly both with respect to the oppositely polarized surface and the unsupported Pt(100) film. More importantly, Table I demonstrates that the presence of the polarized substrate can shift the dissociative adsorption energy significantly closer to the optimal range. For instance, the dissociative chemisorption energy for $N_2$ on Pt(100) is large and positive (+1.60~eV, unfavorable). Supporting the Pt on $P^-$ $TiO_2$-terminated $PbTiO_3$ reduces $E_{diss}$ to +0.74~eV, but switching the polarization direction to P+ results in a negative (−0.12~eV, favorable) $E_{diss}$, near the optimum for this reaction. This effect can greatly accelerate the conversion of $N_2$ and $H_2$ into ammonia, since $N_2$ dissociation is the rate-determining step.

With CO dissociative chemisorption on a supported monolayer of Pt, the polarization direction of the substrate has the opposite effect: At the surface of both Pt(100) and Pt on P+ PbO- and $TiO_2$-terminated $PbTiO_3$, CO dissociative chemisorption is unfavorable, but becomes favorable for a negative $TiO_2$-terminated substrate polarization. The catalyst Pt on $P^-$ $TiO_2$-terminated $PbTiO_3$ can be used in synthetic fuel production via Fischer-Tropsch synthesis, in which CO dissociation is the rate-determining step[25] in the formation of liquid hydrocarbons from $H_2$ and CO. The difference between polarization dependences of CO and $N_2$ $E_{diss}$ can be explained by the interaction of the preferred binding sites of the constituent atoms with the substrate polarization, as discussed below.

Conversely, changing the substrate polarization can shift $E_{diss}$ away from the optimal range, preventing or inhibiting dissociation below a certain temperature. Based on the kinetic model described above, the changes in optimal reaction temperature due to polarization switching were computed according to the methods described in reference 22 to illustrate this effect. For reactions involving $O_2$ dissociative adsorption, reversing the oxide substrate polarization leads to a ~440 K shift in the optimal reaction temperature over one monolayer of Pt. This is due to the large difference in $O_2$ $E_{diss}$ between the positively and negatively polarized substrates (Table I). Such an effect may be desirable for inhibiting corrosion and limiting catalyst degradation due to surface oxidation of the reactive metal.

TABLE I

Computed dissociative chemisorption energies on $PbTiO_3$/Pt as a function of polarization direction for monolayer and bilayer Pt films. Energies are in eV.

| interface | P | $n_{Pt}$ | CO | $O_2$ | NO | $N_2$ |
|---|---|---|---|---|---|---|
| PbO/Pt | $P^+$ | 1 | 0.23 | −1.24 | −1.77 | 0.28 |
| PbO/Pt | $P^+$ | 2 | 0.68 | −1.54 | −1.12 | 1.88 |
| $TiO_2$/Pt | $P^+$ | 1 | 0.21 | −1.20 | −1.95 | −0.12 |

TABLE I-continued

Computed dissociative chemisorption energies on PbTiO$_3$/Pt as a function of polarization direction for monolayer and bilayer Pt films. Energies are in eV.

| interface | P | n$_{Pt}$ | CO | O$_2$ | NO | N$_2$ |
|---|---|---|---|---|---|---|
| TiO$_2$/Pt | P$^+$ | 2 | 0.48 | −1.56 | −1.27 | 1.60 |
| PbO/Pt | P$^-$ | 1 | 0.04 | −2.40 | −1.94 | 1.10 |
| PbO/Pt | P$^-$ | 2 | 0.49 | −1.54 | −1.42 | 1.28 |
| TiO$_2$/Pt | P$^-$ | 1 | −0.07 | −2.54 | −2.19 | 0.74 |
| TiO$_2$/Pt | P$^-$ | 2 | 0.65 | −1.38 | −1.21 | 1.54 |
| Pt(100) | | | 0.54 | −1.62 | −1.30 | 1.60 |
| Pt(111)[22] | | | 0.37 | −2.17 | −1.27 | 1.37 |

Changes in chemisorption energy and E$_{diss}$ are strongly correlated with site preference and PbTiO$_3$ substrate polarization. For simplicity, we concentrate on monolayer results. FIG. 3 b-d show that adsorption on the P+ surface is more favorable for the C and N atoms, while O strongly prefers P$^-$. Because the preference of O for P$^-$ is the strongest, O-containing CO, O$_2$, and NO all have lower E$_{diss}$ on the P$^-$ PbO/Pt interface, while N$_2$ dissociates most readily over the P$^+$ surface (Table I). FIG. 3 f-h also show that C and N atoms prefer hollow site adsorption, while the O atom favors the bridge site. This suggests that the P$^-$ surface enhances E$_{diss}$ if one or more of the constituent atoms preferentially adsorbs at a top or bridge site. On the other hand, the P$^+$ surface lowers the dissociative chemisorption energy when both atoms of the dissociated molecule adsorb at hollow sites.

Without being bound by any theory of operation, these trends can be understood by considering the effects of substrate polarization on the Pt d-band density of states (DOS). The d$_z^2$ and d$_{xz/yz}$ Pt orbitals participate in bonding at the bridge site, while the dxz/yz contribution dominates for the hollow site. The DOS for a monolayer-thick Pt film (FIG. 2) shows a large increase in unfilled d$_z^2$ states at the P$^-$ surface. This appears to be due to Pt d$_z^2$ covalent bonding with O p$_z$ at the P$^-$ interface, which results in a low-energy bonding state around −5 eV and an unfilled anti-bonding state.[9] This covalent interaction can be seen clearly in FIG. 1 as well. The increased availability of empty states induced by these interfacial interactions strengthens top or bridge-site chemisorption. By contrast, there are almost no free d$_z^2$ states near the Fermi level for the P$^+$ surface. This weakens P$^+$ bridge-site adsorbate-metal bonding and makes O adsorption much stronger on P− than on P$^+$. FIG. 2 also shows that the d$_{xz/yz}$ orbitals shift upwards on the P$^+$ substrate, forming a large peak and increasing the availability of states just below the Fermi level, and thereby enhancing hollow site back-bonding to adsorbates. In contrast, the peak in the d$_{xz/yz}$ orbitals shifts away from the Fermi level on the P$^-$ substrate, decreasing the number of states available for back-bonding. Consequently, the P$^+$ substrate is favored over the P$^-$ substrate for hollow site C and N adsorption.

The results described herein have demonstrated the ability to significantly alter the surface electronic structure and catalytic activity of a metal thin film by switching the polarization of an underlying ferroelectric oxide. These alterations appear to arise from a combination of polarization, chemical, and structural changes, and that these changes influence the metal surface properties to a distance of almost 1 nm away from the oxide surface. Furthermore, the analysis of the electronic structure suggests that these phenomena are not limited to Pt films, but should be observable for a range of ferroelectric/transition metal systems. These results indicate that the reactivity and selectivity of catalysts can be tuned in real time by applying electric fields to ferroelectric oxide-supported films.

Experimental studies have shown that the magnitude of the electric field required to flip the polarization (the coercive field) in PbTiO$_3$ films with Pt electrodes is within an experimentally feasible range. Based on the similar trends observed for TiO$_2$— and PbO-terminated substrates, other ferroelectric materials with smaller coercive fields, such as Pb(Zr,Ti)O$_3$ and BaTiO$_3$, are expected to behave similarly, providing further opportunities to optimize ferroelectric-supported metal catalyst systems for various applications.

Based on the description of the embodiments of the invention, it can be appreciated that this invention is not limited to the particular embodiments disclosed but it is intended to cover modifications that are within the spirit and scope of the invention.

REFERENCES

1. M. Valden, X. Lai, and D. W. Goodman, Science 281, 1657 (1998).
2. M. Haruta, Catal. Today 36, 153 (1997).
3. U. Heiz and E. L. Bullock, J. Mater. Chem. 14, 564 (2004).
4. K. Okumura, T. Kobayashi, H. Tanaka, and M. Niwa, Appl. Catal. B 44, 325 (2003),
5. S. Ichikawa, T. Akita, M. Okumura, M. Haruta, K. Tanaka, and M. Kohyama, Journal of Electron Microscopy 52, 21 (2003).
6. A. M. Doyle, et al., Angew, Chem.-Int. Ed. 42, 5240 (2003).
7. J. R. B. Gomes, F. Illas, N. C. Hernández, A. Márquez, and J. F. Sanz, Phys. Rev. B 65, 125414 (2002).
8. L. M. Molina and B. Hammer, Phys. Rev. Lett. 90, 206102 (2003).
9. V. R. Cooper, A. M. Kolpak, Y. Yourdshahyan, and A. M. Rappe, Phys. Rev. B 72, 081409 (2005).
10. H. Stadler, Phys. Rev. Lett. 14, 979 (1965).
11. G. Parravano, J. Chem. Phys. 20, 342 (1952).
12. C. Park and R. T. K. Baker, Chem. Mater. 14, 273 (2002).
13. C. Park and R. T. K. Baker, J. Phys. Chem. B 104, 4418 (2000).
14. Y. Inoue and Y. Watanabe, Catalysis Today 16, 487 (1993).
15. N. Saito, Y. Yukawa, and Y. Inoue, J. Phys. Chem. B 106, 10179 (2002).
16. P. Hohenberg and W. Kohn, Phys. Rev. 136, B864 (1964).
17. W. Kohn and L. J. Sham, Phys. Rev. 140, A1133 (1965).
18. J. P. Perdew, K. Burke, and M. Ernzerhof, Phys. Rev. Lett. 77, 3865 (1996).
19. B. Hammer, L. B. Hansen, and J. K. Nørskov, Phys. Rev. B 59, 7413 (1999).
20. A. J. Francis, Y. Cao, and P. A. Salvador, Thin Solid Films 496, 317 (2006).
21. N. Sai, A. M. Kolpak, and A. M. Rappe, Phys. Rev. B 72, 020101 (2005).
22. T. Bligaard, J. K. Nørskov, S. Dahl, J. Matthiesen, C. H. Christensen, and J. Sehested, J. Catal. 225, 206 (2004).
23. S. Dahl, A. Logadottir, C. J. H. Jacobsend, and J. K. Nørskov, Appl. Catal. A 222, 19 (2001).
24. S. E. Mason, I. Grinberg, and A. M. Rappe, Phys. Rev. B 69, 161401 (2004).
25. Q. Ge and M. Neurock, J. Phys. Chem. B 110, 15368 (2006).

What is claimed:

1. A method of controlling the activity of a catalyst, comprising:
   providing a catalyst, comprising:
      a ferroelectric substrate of finite thickness comprising two opposing surfaces, the ferroelectric substrate being characterized as having a polarization wherein the ferroelectric substrate comprises PbTiO$_3$;

an electrode surmounting one of the surfaces of the ferroelectric substrate; and a catalytically active material surmounting the surface of the ferroelectric substrate opposing the electrode; and subjecting the ferroelectric substrate to a controllable electric field to give rise to a modulation of the polarization of the ferroelectric substrate, whereby the modulation of the polarization controllably alters the activity of one or more chemical species on the catalytically active material.

2. The method of claim 1, wherein the catalytically active metal comprises Pt.

3. The method of claim 1, wherein the $PbTiO_3$ is terminated with $TiO_2$.

4. A method of controlling the activity of a catalyst, comprising:

providing a catalyst, comprising:

a ferroelectric substrate of finite thickness comprising two opposing surfaces, the ferroelectric substrate being characterized as having a polarization;

an electrode comprising a metallic oxide surmounting one of the surfaces of the ferroelectric substrate, wherein the metallic oxide comprises indium-tin-oxide, $SrTiO_3$, $SrRuO_3$, or any combination thereof, and a catalytically active material surmounting the surface of the ferroelectric substrate opposing the electrode; and subjecting the ferroelectric substrate to a controllable electric field to give rise to a modulation of the polarization of the ferroelectric substrate, whereby the modulation of the polarization controllably alters the activity of one or more chemical species on the catalytically active material.

5. A method of controlling the activity of a catalyst, comprising:

providing a catalyst, comprising:

a ferroelectric substrate of finite thickness comprising two opposing surfaces, the ferroelectric substrate being characterized as having a polarization;

an electrode surmounting one of the surfaces of the ferroelectric substrate; and a catalytically active material surmounting the surface of the ferroelectric substrate opposing the electrode, wherein the catalytically active material comprises Pt, Pd, Rh, Ru, Fe, Ni, V, Ti, Al, or any combination thereof; and subjecting the ferroelectric substrate to a controllable electric field to give rise to a modulation of the polarization of the ferroelectric substrate, whereby the modulation of the polarization controllably alters the activity of one or more chemical species on the catalytically active material.

6. A tunable catalyst, comprising:

a ferroelectric substrate of finite thickness comprising two opposing surfaces, the ferroelectric substrate being characterized as having a polarization;

an electrode comprising a metallic oxide surmounting one of the surfaces of the ferroelectric substrate, wherein the metallic oxide comprises indium-tin-oxide, $SrTiO_3$, or any combination thereof; and a catalytically active material surmounting the surface of the ferroelectric substrate opposing the electrode, wherein the electrode and the catalytically active material are capable of subjecting the ferroelectric substrate to a controllable electric field to modulate the polarization of the ferroelectric substrate, whereby the modulation of the polarization is capable of controllably altering the activity of one or more chemical species on the catalytically active material.

7. A tunable catalyst, comprising:

a ferroelectric substrate of finite thickness comprising two opposing surfaces, the ferroelectric substrate being characterized as having a polarization;

an electrode surmounting one of the surfaces of the ferroelectric substrate, and a catalytically active material surmounting the surface of the ferroelectric substrate opposing the electrode, wherein the catalytically active material comprises Pt, Pd, Rh, Ru, Fe, Ni, V, Ti, Al, or any combination thereof, wherein the electrode and the catalytically active material are capable of subjecting the ferroelectric substrate to a controllable electric field to modulate the polarization of the ferroelectric substrate, whereby the modulation of the polarization is capable of controllably altering the activity of one or more chemical species on the catalytically active material.

* * * * *

UNITED STATES PATENT AND TRADEMARK OFFICE
CERTIFICATE OF CORRECTION

PATENT NO.       : 8,592,767 B2                                   Page 1 of 1
APPLICATION NO. : 12/376492
DATED            : November 26, 2013
INVENTOR(S)      : Rappe et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1269 days.

Signed and Sealed this
Twenty-second Day of September, 2015

Michelle K. Lee
*Director of the United States Patent and Trademark Office*